(12) United States Patent
Kato et al.

(10) Patent No.: US 9,966,395 B2
(45) Date of Patent: May 8, 2018

(54) SOLID-STATE IMAGE SENSOR AND METHOD OF MANUFACTURING THE SAME

(71) Applicant: CANON KABUSHIKI KAISHA, Tokyo (JP)

(72) Inventors: Satoshi Kato, Kawasaki (JP); Shuji Tobashi, Hiratsuka (JP); Masayuki Tsuchiya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/415,245

(22) Filed: Jan. 25, 2017

(65) Prior Publication Data

US 2017/0229498 A1 Aug. 10, 2017

(30) Foreign Application Priority Data

Feb. 5, 2016 (JP) .................................. 2016-021236

(51) Int. Cl.
*H01L 27/146* (2006.01)
*H04N 5/378* (2011.01)

(52) U.S. Cl.
CPC .. *H01L 27/14603* (2013.01); *H01L 27/14643* (2013.01); *H01L 27/14689* (2013.01); *H04N 5/378* (2013.01)

(58) Field of Classification Search
CPC ......... H01L 27/14654; H01L 27/14603; H01L 27/14643
See application file for complete search history.

(56) References Cited

U.S. PATENT DOCUMENTS

| | | | |
|---|---|---|---|
| 7,741,593 B2 | 6/2010 | Iwata et al. | |
| 7,759,222 B2 | 7/2010 | Morii et al. | |
| 7,817,199 B2 | 10/2010 | Yamashita et al. | |
| 8,084,729 B2 | 12/2011 | Kato et al. | |
| 9,136,407 B2 | 9/2015 | Tsuchiya | |
| 9,197,833 B2 | 11/2015 | Kato | |
| 9,267,840 B2 | 2/2016 | Kato | |
| 9,270,914 B2 | 2/2016 | Kato | |
| 9,305,954 B2 | 4/2016 | Kato et al. | |
| 2011/0171770 A1* | 7/2011 | Mishima | H01L 27/14603 438/60 |

(Continued)

FOREIGN PATENT DOCUMENTS

JP 2008-098373 A 4/2008

*Primary Examiner* — Asok K Sarkar
*Assistant Examiner* — Grant Withers
(74) *Attorney, Agent, or Firm* — Fitzpatrick, Cella, Harper & Scinto

(57) ABSTRACT

A solid-state image sensor is provided. The sensor includes a first transistor including a first diffusion region, a second transistor including a second diffusion region and an insulation film arranged over these transistors. The insulation film includes a first and a second film. A first portion of the first diffusion region covered with the insulation film includes a second portion covered with only the second film. A third portion of the second diffusion region covered with the insulation film includes a fourth portion covered with the first and second film. A stress in the fourth portion is larger than the second portion. A proportion of an area of the first portion except the second portion to an area of the first portion is lower than a proportion of an area of the fourth portion to an area of the third portion.

16 Claims, 16 Drawing Sheets

(56) References Cited

U.S. PATENT DOCUMENTS

| | | | |
|---|---|---|---|
| 2016/0035774 A1* | 2/2016 | Noh | H01L 27/14614 |
| | | | 257/229 |
| 2016/0234409 A1 | 8/2016 | Tsuchiya et al. | |
| 2016/0301889 A1 | 10/2016 | Kato | |
| 2017/0287961 A1* | 10/2017 | Kobayashi | H01L 27/14623 |
| 2018/0012924 A1* | 1/2018 | Umebayashi | H01L 27/14627 |
| 2018/0019279 A1* | 1/2018 | Itonaga | H04N 5/374 |

\* cited by examiner

F I G. 12
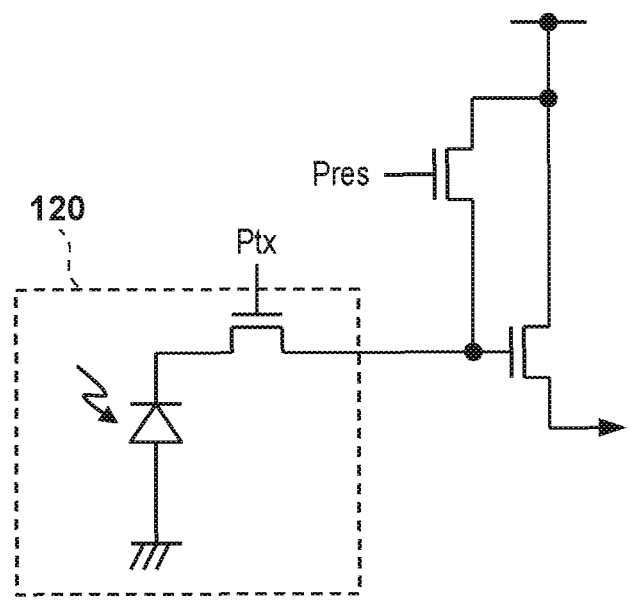

SOLID-STATE IMAGE SENSOR AND METHOD OF MANUFACTURING THE SAME

BACKGROUND OF THE INVENTION

Field of the Invention

The present invention relates to a solid-state image sensor and a method of manufacturing the same.

Description of the Related Art

There is widely known a technique of suppressing reflection of incident light on a substrate surface and increasing pixel sensitivity by an insulation film having a stacked structure where a protective film using silicon nitride or the like which is different, in refractive index, from an interlayer film using silicon oxide or the like is formed between the interlayer film and a substrate in a solid-state image sensor. In order to improve flatness of the interlayer film, there is known a technique of providing the protective film from an image sensing region in which a pixel is arranged to a peripheral region as in Japanese Patent Laid-Open No. 2008-98373.

SUMMARY OF THE INVENTION

However, if a material which generates, on a substrate, a stress larger than that on an interlayer film by covering the substrate is used as a protective film, crystallinity of a silicon substrate may be lost near the boundary between a transistor and an element isolation region formed by LOCOS or the like in a peripheral region. If crystallinity of the substrate is lost near the boundary between the transistor and the element isolation region, crystal defects in a diffusion region of the transistor increase, and an off leakage current of the transistor is increased by these crystal defects. Signals from pixels are read out to the peripheral region for each row, held in a holding capacitor, and then sequentially read out to a processing circuit at a subsequent stage. If the off leakage current increases, noise caused by the off leakage current may be superimposed on the signals while reading out the signals from the holding capacitor to the circuit at the subsequent stage, degrading the quality of a captured image to be obtained.

Some embodiments of the present invention provide a technique of preventing the quality of the captured image from degrading by the stress generated on the substrate in a solid-state image sensor in which an insulation film having a stacked structure is arranged in an image sensing region and the peripheral region.

According to some embodiments, a solid-state image sensor comprising a substrate which includes an image sensing region in which a pixel is arranged and a peripheral region which includes a circuit configured to process a signal output from the pixel, and a first insulation film arranged over the substrate, wherein the peripheral region includes: a holding capacitor configured to hold the signal, a first transistor including a first diffusion region electrically connected to the holding capacitor; and a second transistor including a second diffusion region, and configured to perform at least one of control of the pixel, control of the first transistor, and processing of the signal, wherein the first insulation film includes: a first film including a first material; and a second film including a second material on the first film, wherein the first film and the second film are arranged in the image sensing region and the peripheral region, wherein a first portion of the first diffusion region is covered with the first insulation film, wherein the first portion includes a second portion covered with the second film without intervening the first film, wherein a third portion of the second diffusion region is covered with the first insulation film, wherein the third portion includes a fourth portion covered with the first film and the second film, wherein a stress generated in the substrate from the fourth portion is larger than a stress generated in the substrate from the second portion, and wherein in a planar view with respect to the substrate, a proportion of an area of the first portion except the second portion to an area of the first portion is lower than a proportion of an area of the fourth portion to an area of the third portion, is provided.

According to some other embodiments, a solid-state image sensor comprising a substrate which includes an image sensing region in which a pixel is arranged and a peripheral region which includes a circuit configured to process a signal output from the pixel, and a first insulation film arranged over the substrate, wherein the peripheral region includes: a holding capacitor configured to hold the signal, a first transistor including a first diffusion region electrically connected to the holding capacitor; and a second transistor including a second diffusion region, and configured to perform at least one of control of the pixel, control of the first transistor, and processing of the signal, wherein the first insulation film includes: a first film including silicon nitride; and a second film including silicon oxide on the first film, wherein the first film and the second film are arranged in the image sensing region and the peripheral region, wherein a first portion of the first diffusion region is covered with the first insulation film, wherein the first portion includes a second portion covered with the second film without intervening the first film, wherein a third portion of the second diffusion region is covered with the first insulation film, wherein the third portion includes a fourth portion covered with the first film and the second film, and wherein in a planar view with respect to the substrate, a proportion of an area of the first portion except the second portion to an area of the first portion is lower than a proportion of an area of the fourth portion to an area of the third portion, is provided.

According to some other embodiments, a solid-state image sensor comprising a substrate which includes an image sensing region in which a pixel is arranged and a peripheral region which includes a circuit configured to process a signal output from the pixel, and a first insulation film arranged over the substrate, wherein the peripheral region includes: a holding capacitor configured to hold the signal, a first transistor including a first diffusion region electrically connected to the holding capacitor; and a second transistor including a second diffusion region, and configured to perform at least one of control of the pixel, control of the first transistor, and processing of the signal, and wherein the first insulation film includes: a first film including silicon nitride; and a second film including silicon oxide on the first film, wherein the first film and the second film are arranged in the image sensing region and the peripheral region, a wall surface of a first contact hole formed in the first insulation film for a first contact plug connected to the first diffusion region is formed by the second film, the first film is arranged apart from the first contact plug, and a wall surface of a second contact hole, formed in the first insulation film, for a second contact plug connected to the second diffusion region is formed by the first film and the second film, is provided.

According to some other embodiments, a method of manufacturing a solid-state image sensor, the method comprising: forming a substrate which includes an image sensing region in which a pixel is arranged, and a peripheral region which includes a circuit configured to process a signal output from the pixel, the peripheral region including a holding capacitor configured to hold the signal, a first transistor including the first diffusion region electrically connected to the holding capacitor, and a second transistor including a second diffusion region, and configured to perform at least one of control of the pixel, control of the first transistor, and processing of the signal; and forming a first insulation film including a first film and a second film above the substrate, wherein the forming the first insulation film includes depositing a film including a first material over the image sensing region and the peripheral region, forming the first film by removing at least a part of the film including the first material on the first diffusion region, and forming the second film by using a second material over the image sensing region and the peripheral region after the forming the first film, a stress generated in the substrate from a portion covered with the first film and the second film is larger than a stress generated in the substrate from a portion covered with the second film without intervening the first film, a first portion of the first diffusion region is covered with the first insulation film, the first portion includes a second portion covered with the second film without intervening the first film, a third portion of the second diffusion region is covered with the first insulation film, the third portion includes a fourth portion covered with the first film and the second film, and in a planar view with respect to the substrate, a proportion of an area of the first portion except the second portion to an area of the first portion is lower than a proportion of an area of the fourth portion to an area of the third portion, is provided.

Further features of the present invention will become apparent from the following description of exemplary embodiments (with reference to the attached drawings).

BRIEF DESCRIPTION OF THE DRAWINGS

FIG. 12 is a circuit diagram showing a pixel of a solid-state image sensor according to an embodiment of the present invention.

DESCRIPTION OF THE EMBODIMENTS

Figure 1:
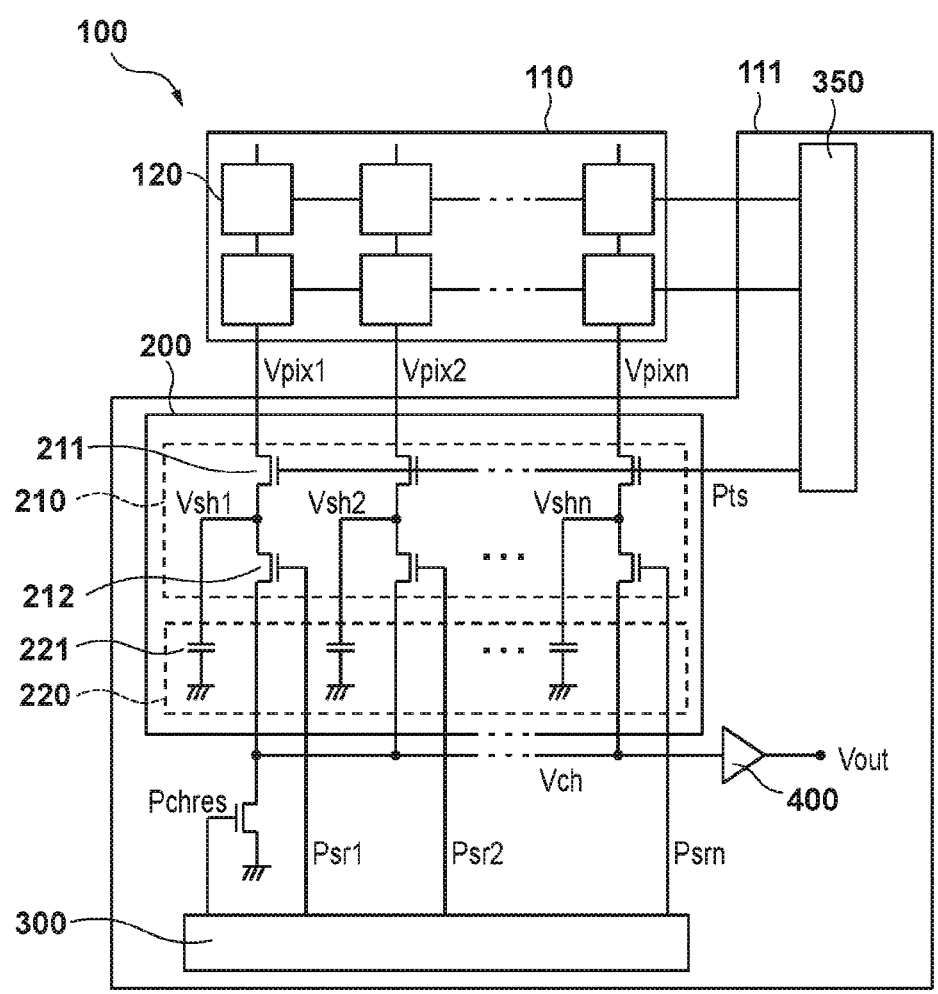
FIG. 1 is a block diagram showing an example of the arrangement of a solid-state image sensor according to an embodiment of the present invention.

Practical embodiments of a solid-state image sensor of the present invention will be described below with reference to the accompanying drawings. Note that in a description and the drawings below, common reference numerals denote common arrangements throughout the plurality of drawings. Therefore, the common arrangements will be described by referring to the plurality of drawings mutually and descriptions of the arrangements denoted by the common reference numerals will be omitted as needed.

The solid-state image sensor according to some embodiments of the present invention will be described with reference to FIGS. 1 to 4. FIG. 1 is a block diagram showing an example of the arrangement of a solid-state image sensor 100 according to a first embodiment of the present invention. The solid-state image sensor 100 includes an image sensing region 110 in which pixels 120 are arranged and a peripheral region 111 for driving the pixels 120 or processing signals output from the pixels 120.

The pixels 120 include photoelectric conversion elements each outputting a signal having a predetermined voltage value in accordance with incident light and are arranged, for example, in a two-dimensional array in the image sensing region 110. Alternatively, for example, the pixels 120 may be arranged in a one-dimensional array in the image sensing region 110. The pixels 120 output the signals to the peripheral region 111 via a common vertical output line for each column.

The peripheral region 111 includes a signal holding unit 200, control units 300 and 350 which control the pixels 120 and the signal holding unit 200, and an output amplifier 400 which outputs signals held by the signal holding unit 200 outside. The signal holding unit 200 includes a transfer unit 210 and a holding capacitor unit 220, and is a sample-and-hold circuit which temporarily holds the signals output from the pixels 120. The holding capacitor unit 220 includes holding capacitors 221 which hold the signals received from the pixels. The transfer unit 210 includes transistors 211 which perform a transfer operation for inputting the signals from the pixels 120 to the holding capacitors 221 and transistors 212 which perform a transfer operation for outputting the signals from the holding capacitors 221 to the output amplifier 400. Diffusion regions of one of the transistors 211 and 212 are electrically connected to the holding capacitors 221 directly by using a wiring without intervening other elements or the like. The control unit 300 includes a shift register which generates control signals Psr for outputting the signals held in the holding capacitors 221 of the holding capacitor unit 220 to the output amplifier 400 via a horizontal output line shared among the respective columns. The control unit 300 controls the transistors 212 of the transfer unit 210 by the control signals Psr. This horizontal output line is reset by a control signal Pchres after the signals on the respective columns are read out. The control signal Pchres may be supplied from the control unit 300 as shown in FIG. 1 or may be supplied from another control unit. The control unit 350 controls the operation of each pixel 120 in the image sensing region 110. In addition, the control unit 350 generates a control signal Pts for transferring the signals generated in the pixels 120 to the signal holding unit 200 and controls the transistors 211 of the transfer unit 210 by the control signal Pts. In this embodiment, two control units 300 and 350 control the pixels 120 and the signal holding unit 200. However, the present invention is not limited to this mode. For example, the control units 300 and 350 may be integrated, or three or more control units may control the image sensing region 110 and the signal holding unit 200. The output amplifier 400 sets a potential Vch of a signal of the horizontal output line as an input voltage and outputs a potential Vout as a signal to a circuit at a subsequent stage. Electrode nodes Vpix are nodes in portions where the image sensing region 110 and the signal holding unit 200 are connected. Electrode nodes Vsh are nodes in portions where the holding capacitors 221, and the transistors 211 and 212 are connected. 1, 2, to n suffixed to the control signals Pts, Psr, and Pchres, the potentials Vch and Vout, and the electrode nodes Vpix and Vsh, respectively, indicate the respective columns.

Figure 2:
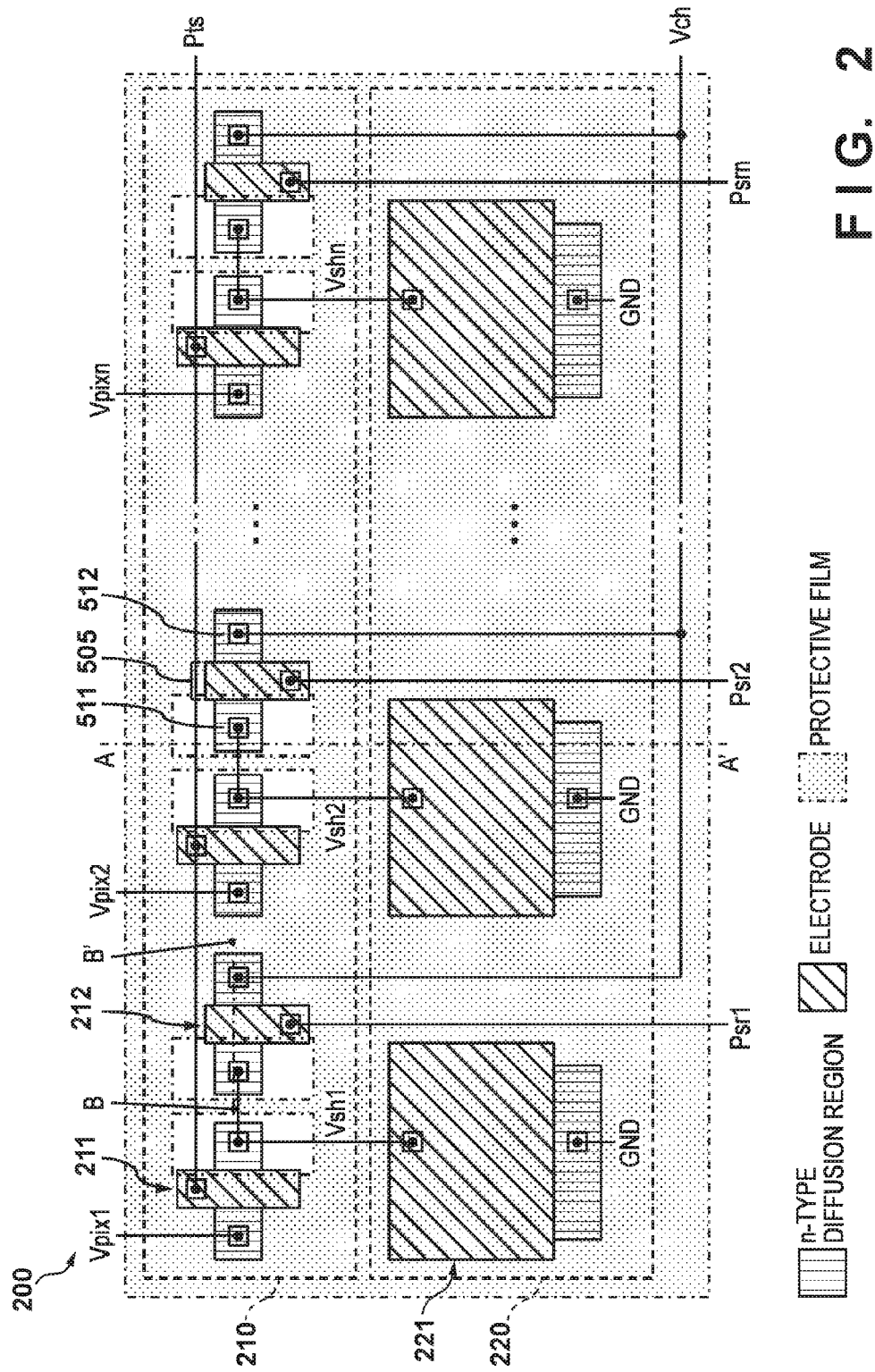
FIG. 2 is a plan view showing a circuit of the solid-state image sensor in FIG. 1.
Figure 3A:
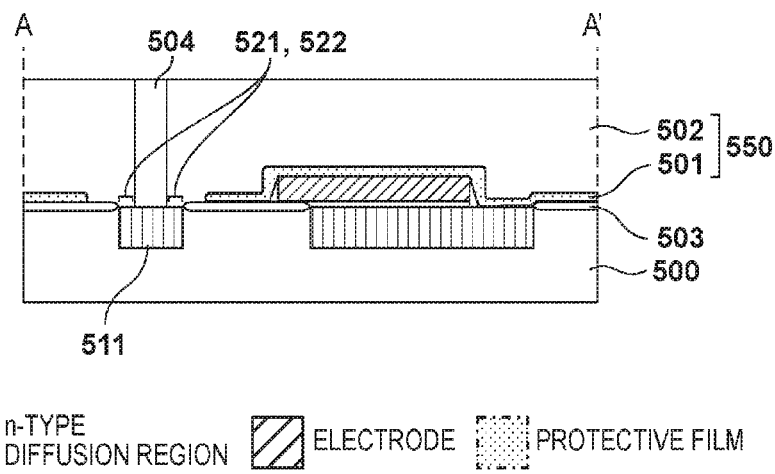
FIGS. 3A to 3D are sectional views showing the circuit of the solid-state image sensor in FIG. 1.
Figure 3B:
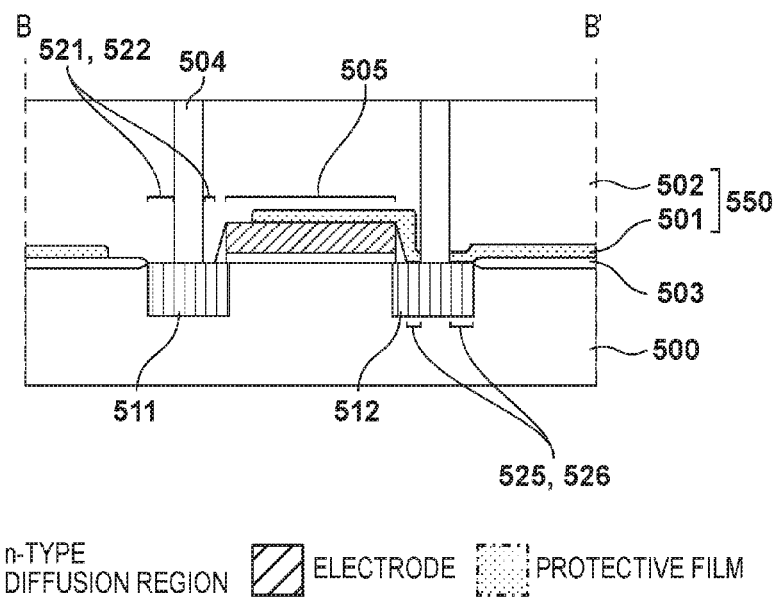

FIG. 2 is a plan view showing the signal holding unit 200 shown in FIG. 1. FIG. 3A is a sectional view taken along a line A-A' in FIG. 2. FIG. 3B is a sectional view taken along a line B-B' in FIG. 2. In this embodiment, respective elements arranged in the signal holding unit 200 are arranged in a p-type well (p-well) of a substrate 500 using a semiconductor with a potential being coupled to ground (connected to GND). Each of the diffusion regions of the transistors 211 and 212, and diffusion regions of the holding capacitors 221 each being connected to GND is described as an n-type diffusion region. However, the conductivity type of a well in which the peripheral region 111 of the substrate 500 is arranged and the conductivity type of each diffusion region are not limited to this. Each of them may have an opposite conductivity type. In FIG. 2, the wiring is simplified as a line which connects contact holes arranged in respective electrodes and diffusion regions.

As shown in FIGS. 3A and 3B, an insulation film 550 which serves as the first insulation film having a stacked structure using materials different in refractive index is arranged on the substrate 500. The insulation film 550 is made of a protective film 501 and an interlayer film 502. The protective film 501 is arranged on the side closer to the substrate 500 than the interlayer film 502, and is arranged between the substrate 500 and a part of the interlayer film 502. In this embodiment, the protective film 501 using silicon nitride as a material and the interlayer film 502 using silicon oxide as a material, respectively, are formed on the substrate 500 made of the semiconductor using silicon. Silicon nitride and silicon oxide, respectively, may be formed by using plasma CVD, thermal CVD, or the like. BPSG, BSG, PSG, NSG (Non-doped Silicate Glass), or the like may be used as silicon oxide used for the interlayer film 502. The protective film 501 can protect the respective elements arranged on the substrate 500 from, for example, various processes in manufacture, water intrusion, or the like. The interlayer film 502 functions as an interlayer insulation film which insulates the substrate 500 and a wiring layer arranged on the substrate 500 from each other. The protective film 501 can also function as an interlayer insulation film. Although not shown in FIGS. 1 and 2, the insulation film 550 which includes the protective film 501 and the interlayer film 502 may be arranged not only on the image sensing region 110 but also on the peripheral region 111 arranged on the substrate 500. That is, the protective film 501 and the interlayer film 502 are arranged on the image sensing region 110 and the peripheral region 111. Therefore, the protective film 501 different in refractive index from the interlayer film 502 can also function as an antireflection film in the image sensing region 110.

As shown in FIGS. 2, and 3A and 3B, the protective film 501 is not arranged in portions on diffusion regions 511, out of the diffusion regions of the transistors 211 and 212, serving as the first diffusion regions which are connected to the electrode nodes Vsh electrically connected to the holding capacitors 221. That is, the diffusion regions 511 electrically connected to the holding capacitors 221 of the transistors 211 and 212 are not covered with the protective film 501.

The effect of this embodiment will now be described. A case in which silicon nitride is used for the protective film 501, and silicon oxide is used for the interlayer film 502 as described above, or a case in which a material which generates, on the substrate, a stress larger than that on the interlayer film 502 by covering the substrate is used for the protective film 501 will be considered. In this case, a stress generated on a silicon substrate covered with silicon nitride becomes larger than a stress generated on the silicon substrate covered with silicon oxide. Hence, a stress generated in the substrate 500 from a portion where the interlayer film 502 and the protective film 501 are stacked becomes larger than a stress generated in the substrate 500 from a portion where the protective film 501 is not arranged but the interlayer film 502 is arranged. Consequently, a large stress may be generated on the substrate 500 by introducing the protective film 501, and crystallinity of the substrate 500 may be lost in a boundary portion between each diffusion region of the transistors and an element isolation region 503 having a structure of STI, LOCOS, or the like on the substrate 500. If crystallinity of the substrate 500 is lost, crystal defects may increase on the periphery of each diffusion region of the transistors near the element isolation region 503. These crystal defects may increase an off leakage current in the transistors 211 and 212. The signals from the pixels 120 are read out to the peripheral region 111, held in the holding capacitors 221, and then sequentially read out to a processing circuit at a subsequent stage. If the off leakage current increases in the transistors 211 and 212, noise caused by the off leakage current may be superimposed on the signals while reading out the signals from the holding capacitors 221 to the circuit at the subsequent stage. This may be a cause of degrading the quality of a captured image to be obtained. To cope with this, without arranging the protective film 501 on the diffusion regions 511 electrically connected to the holding capacitors 221 of the transistors 211 and 212, it is possible to reduce a stress generated near the boundary between each diffusion region 511 and the element isolation region 503 on the substrate 500. This makes it possible to suppress the increase in the crystal defects on the substrate 500, and an increase in a leakage current to GND via the substrate 500 caused when the crystal defects are generated in the diffusion regions 511 of the transistors 211 and 212. This makes it possible to suppress a degradation in held signal and a decrease in the quality of the captured image even if an operation of holding pixel signals in the holding capacitors 221 for a long time is performed.

On the other hand, since the protective film 501 remains provided on the pixels 120, pixel sensitivity is improved by the antireflection effect descried above, making it possible to obtain good image quality. It is further possible, by covering many portions of the peripheral region 111 with the protective film 501, to suppress ghost, a flare, or the like generated by light which diffuses from the peripheral region 111 to the image sensing region 110 even if light cannot be shielded sufficiently by a metal layer, a color filter layer, or the like in the peripheral region 111. FIG. 3D is a sectional view showing the transistors included in the control units 300 and 350 which control the pixels 120 and the signal holding unit 200. Each transistor included in the control units 300 and 350 which control the pixels 120 and the signal holding unit 200 is one example of the second transistor. Each transistor with the diffusion region which is not electrically connected to a corresponding one of the holding capacitors 221 may have a sectional structure similar to that of each transistor included in, for example, the control units 300 and 350 even if it is a transistor which processes the signals output from the pixels 120. This transistor is also one example of the second transistor. Diffusion regions 513 serving as the second diffusion regions of these transistors are not electrically connected to the holding capacitors 221 directly. As shown in FIG. 3D, a portion of the diffusion regions 513 other than contact holes 504 provided in the insulation film 550 so as to be electrically connected to the diffusion regions may be covered with the protective film 501. In the diffusion regions 513, a time for which the signals from the pixels 120 are held is shorter as compared to the diffusion region 511 regardless of whether the signals do not pass through or have passed through the regions, and thus an influence of the off leakage current caused by the crystal defects can be smaller than in the diffusion regions 511.

A diffusion region connected to GND of each holding capacitor 221 is also covered with the protective film 501 as shown in FIGS. 2 and 3A. This is because this diffusion region is fixed to a GND potential.

The diffusion regions of the transistors 211 and 212, and the diffusion regions of the holding capacitors 221 are the same n-type diffusion regions. However, they may have different impurity concentrations. As in each embodiment to be described later, the diffusion regions of the transistors 211 and 212, and the diffusion regions of the holding capacitors 221 may have different impurity concentrations.

A case will now be considered in which there is a step of implanting an impurity from above the protective film 501 in a manufacturing process of the solid-state image sensor 100. If the protective film 501 is only arranged in the image sensing region 110 but not arranged in the peripheral region 111, a transistor characteristic in a portion of the peripheral region 111 where the protective film 501 is not arranged may change. An influence differs depending on an impurity to be implanted and the conductivity type of a diffusion layer. For example, if an n-type impurity is implanted into a p-type diffusion layer, a transistor into which the impurity is implanted has a higher threshold and a smaller driving force than a transistor into which the impurity is not implanted. Consequently, of the peripheral region 111, a digital signal processing unit such as a shift register to which a high-speed operation is demanded is restricted in speed performance. In order to adjust this, if a step of adding a photomask, a step of implanting ions, or the like for adjusting an impurity concentration is added to each region of a target transistor, a chip cost increases accordingly. However, the risk of decreasing a speed by a characteristic fluctuation of a circuit to which the high-speed operation is demanded like the shift register of the control unit 300 is suppressed by arranging the protective film 501 also in the peripheral region 111 as in this embodiment.

Figure 3C:
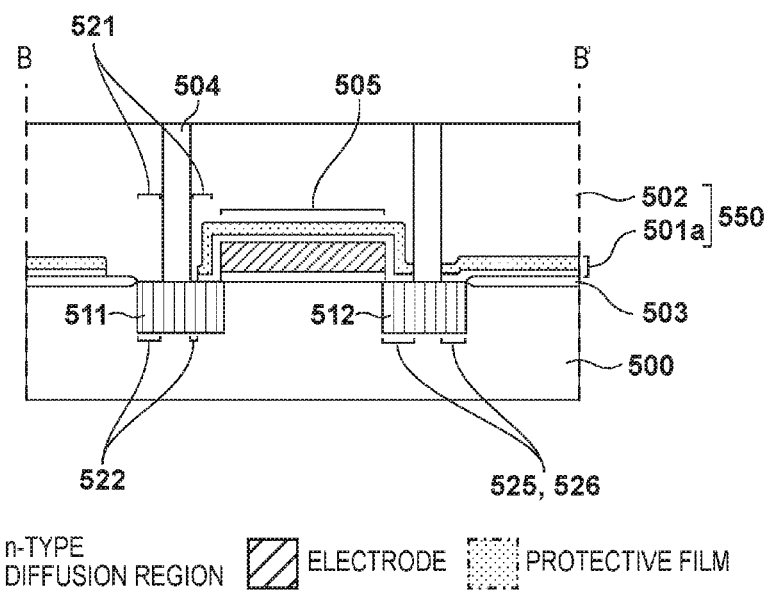
Figure 3D:
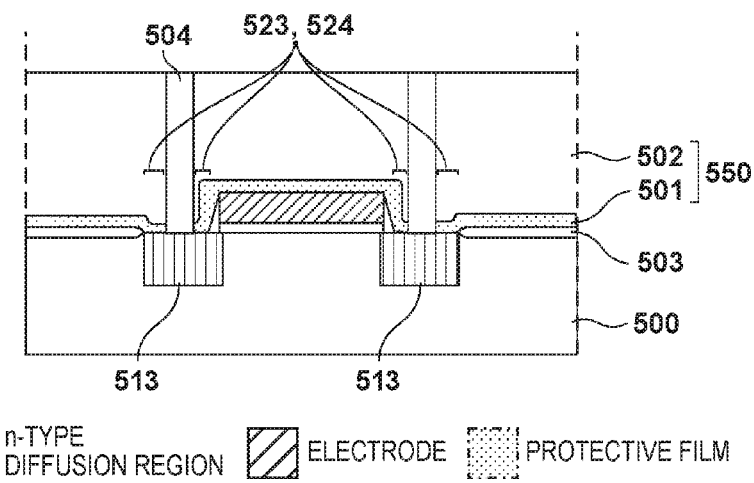

As shown in FIG. 3C, a process of forming an LDD (Lightly Doped Drain) structure in which a protective film 501a made of silicon oxide and silicon nitride functions as a side wall will also be considered. Also in this case, the proportion of the protective film 501a arranged on the diffusion region 511 of the transistor decreases. Accordingly, the stress generated by the protective film 501a on the substrate 500 decreases as compared with a case in which the protective film 501a is provided on the entire surface other than the contact holes 504. It is thus clear that the same effect as in this embodiment described above can be obtained even if the protective film 501 on the diffusion region 511 electrically connected to the holding capacitor 221 is partially removed as shown in FIG. 3C. This effect remains the same even if the protective film 501 made of a single silicon nitride layer is used.

As shown in each of FIGS. 3A to 3C, each portion 521 of the diffusion region 511 is covered with the insulation film 550. Each portion 521 includes portions 522 covered with the interlayer film 502 without intervening the protective film 501. Each portion 521 corresponds to the portion of a respect of the diffusion region 511 other than the portion in which an opening of the contact hole is formed. In the arrangements shown in FIGS. 3A and 3B, the portions 521 and the portions 522 are the same. In the arrangement shown in FIG. 3C, the diffusion region 511 is partially covered with the protective film 501, making the portions 522 smaller than the portions 521. On the other hand, as shown in FIG. 3D, each portion 523 of the diffusion regions 513 is covered with the insulation film 550. Each portion 523 includes portions 524 covered with the protective film 501 and the interlayer film 502. Each portion 523 corresponds to the portion of a respect of the diffusion regions 513 other than the portion in which an opening of the contact hole is formed. In the arrangement shown in FIG. 3D, the portions 523 and the portions 524 are the same. However, the present invention is not limited to this. Each portion 524 may be a part of a corresponding one of the portions 523 by partially covering the corresponding one of the diffusion regions 513 with the interlayer film 502 without intervening the protective film 501. In order to obtain the effect of this embodiment described above, the proportion of an area of each portion 521 except a corresponding one of the portions 522 to an area of each portion 521 may be lower than the proportion of an area of each portion 524 to an area of the corresponding one of the portions 523 in a planar view with respect to the substrate 500. If the portions 521 and the portions 522 are the same as in the arrangements shown in FIGS. 3A and 3B, the proportion of the area of each portion 521 except the corresponding one of the portions 522 to the area of each portion 521 is zero. In the peripheral region 111, the proportion of a film which generates a stronger stress on the substrate in a diffusion region of each transistor on a transmission path of a signal directly connected to the corresponding one of the holding capacitors 221 which holds the signals from the pixels may be lower than the proportion of the film in a diffusion region not connected to a capacitor.

As shown in FIGS. 3A to 3C, the wall surface of the contact hole 504 formed in the insulation film 550 so as to be electrically connected to the diffusion region 511 may be formed by the interlayer film 502. Further, configuration may be taken so that the protective film 501 does not exist in the wall surface of the contact hole 504 formed in the insulation film 550 so as to be electrically connected to the diffusion region 511. That is, the protective film 501 may be arranged apart from a contact plug which is formed so as to be connected to the diffusion region 511. On the other hand, as shown in FIG. 3D, the wall surface of each contact hole 504 formed in the insulation film 550 so as to be electrically connected to the corresponding one of the diffusion regions 513 may be formed by a stacked structure of the protective film 501 and the interlayer film 502. In each contact hole, a contact plug connected to the diffusion region 511, a diffusion region 512, or the corresponding one of the diffusion regions 513 is arranged. Each contact plug can be made of a plurality of electrical conducting materials.

In the transistors 211 and 212, as shown in FIGS. 3B and 3C, the diffusion region 512 which is not electrically connected to the holding capacitor 221 directly may have the same arrangement as the above-described diffusion regions 513. Note that each portion 525 of the diffusion region 512 is covered with the insulation film 550. Each portion 525 include portions 526 covered with the protective film 501 and the interlayer film 502. Each portion 525 corresponds to the portion of a respect of the diffusion region 512 other than the portion in which an opening of the contact hole is formed. In the arrangements shown in FIGS. 3B and 3C, the portions 525 and the portions 526 are the same. However, the present invention is not limited to this. Each portion 526 may be a part of a corresponding one of the portions 525 by partially covering the diffusion region 512 with the interlayer film 502 without intervening the protective film 501. In order to obtain the effect of this embodiment described above, the proportion of an area of each portion 521 except the corresponding one of the portions 522 to an area of each portion 521 in the diffusion region 511 described above may be lower than the proportion of an area of each portion 526 to an area of the corresponding one of the portions 525 in the planar view with respect to the substrate 500. That is, the proportions and the areas covered with the protective film 501 may be different between the diffusion region 511 and the diffusion region 512 included in the same transistor. For example, as shown in FIGS. 2 and 3B, configuration may be taken so that each diffusion region 511 is not covered with the protective film 501, and each diffusion region 512 may be covered with the protective film 501 except at an opening portion of a corresponding one of the contact holes 504.

Figure 4:
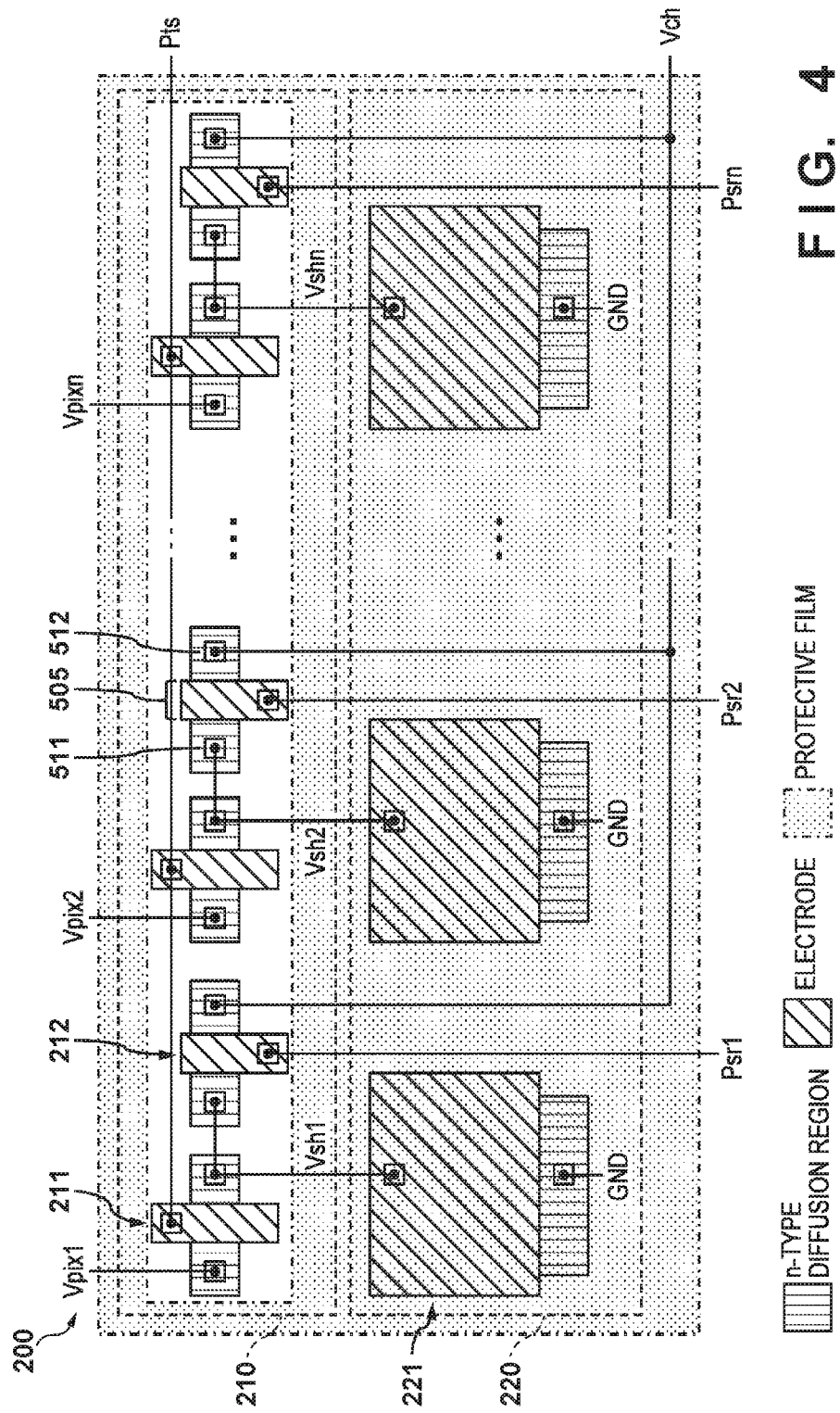
FIG. 4 is a view showing a modification of the plan view showing the circuit of the solid-state image sensor in FIG. 2.

Furthermore, for example, configuration may be taken so that the diffusion regions 511, the diffusion regions 512, and gate portions 505 each configured to form a channel region between the diffusion region 511 and the diffusion region 512 of the transistors 211 and 212 are not covered with the protective film 501, as shown in FIG. 4. The gate portion includes a gate electrode and a gate insulation film. The size of a region from which the protective film 501 is removed can be decided based on a process condition used to remove the protective film 501 or the size of each of the transistors 211 and 212. The size of this region in which the protective film 501 is not arranged can be decided appropriately, for example, so as not to be influenced by a variation in alignment or the like in a photolithography step caused in the manufacture. In order to ensure a margin for this variation in alignment, the region in which the protective film 501 is not arranged may be extended in the signal holding unit 200, as shown in FIG. 4. This makes it possible to suppress the influence caused by a variation in manufacture such as the variation in alignment, stabilize the characteristics of the transistors arranged in the region where the protective film 501 is not arranged, and increase a yield or mass productivity.

Figure 5:
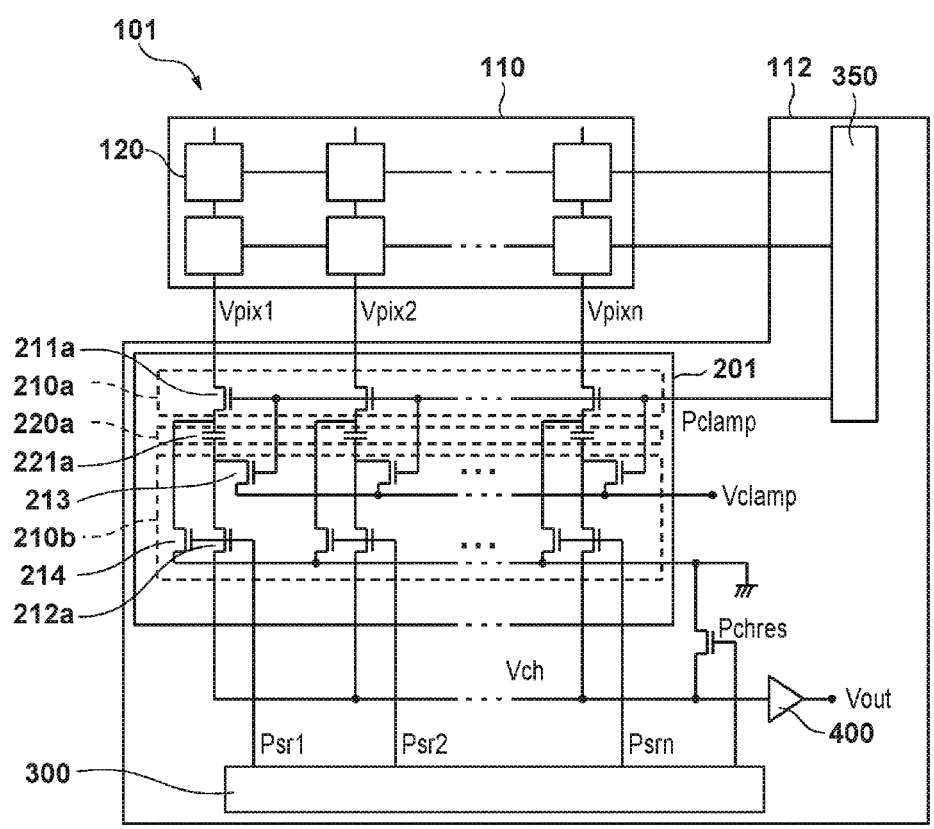
FIG. 5 is a block diagram showing an example of the arrangement of a solid-state image sensor according to an embodiment of the present invention.

A solid-state image sensor according to some embodiments of the present invention will be described with reference to FIGS. 5 to 7. FIG. 5 is a block diagram showing an example of the arrangement of a solid-state image sensor 101 according to a second embodiment of the present invention. As compared with the peripheral region 111 of the solid-state image sensor 100 described above, a peripheral region 112 of the solid-state image sensor 101 has a function of clamping signals output from pixels 120. Therefore, a transfer unit 210 and a holding capacitor unit 220 of a signal holding unit 200 are changed to transfer units 210a and 210b, and a holding capacitor unit 220a of a signal holding unit 201. The arrangement other than this may be the same as the solid-state image sensor 100.

Like the signal holding unit 200, the signal holding unit 201 includes transistors 211a which perform a transfer operation of inputting the signals from the pixels 120 to holding capacitors 221a and transistors 212a which perform a transfer operation of outputting the signals from the holding capacitors 221a to an output amplifier 400. The signal holding unit 201 also includes transistors 213 which clamp the signals output from the pixels 120 and held in the holding capacitors 221a, and transistors 214 configured to reset the holding capacitors 221a. One diffusion region 511 of each transistor 213 is electrically connected to a corresponding one of the holding capacitors 221a, and the other diffusion region 512 is connected to a clamp potential Vclamp. Likewise, one diffusion region 511 of each transistor 214 is electrically connected to the corresponding one of the holding capacitors 221a, and the other diffusion region 512 is connected to GND.

Figure 6:
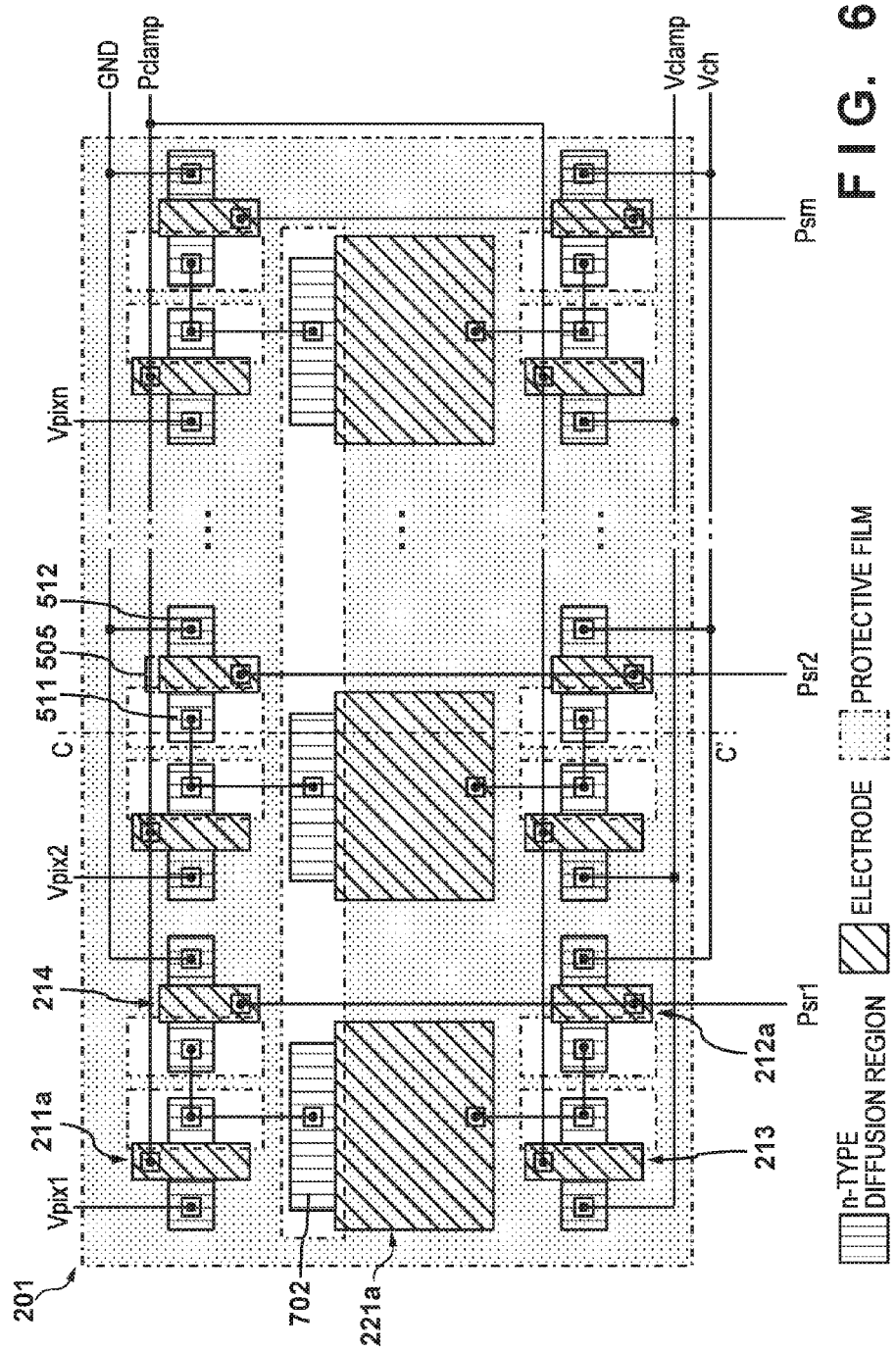
FIG. 6 is a plan view showing a circuit of the solid-state image sensor in FIG. 5.

FIG. 6 is a plan view showing the signal holding unit 201 shown in FIG. 5. FIG. 7 is a sectional view taken along a line C-C' in FIG. 6. As in the first embodiment described above, a protective film 501 is not arranged in portions on the diffusion regions 511 of the diffusion regions of the transistors 211a, 212a, 213, and 214 electrically connected to the holding capacitors 221a, as shown in FIGS. 5 and 6. Configuration may be taken so that the diffusion regions 511 of the transistors 211a, 212a, 213, and 214 electrically connected to the holding capacitors 221a are not covered with the protective film 501. That is, the transistors 211a, 212a, 213, and 214 may have the same arrangements as the transistors 211 and 212 described above. Therefore, for example, the diffusion regions 511 arranged in the transistors 211a, 212a, 213, and 214 except portions of contact holes may partially be covered with the protective film 501, as shown in FIG. 3C. The diffusion regions 511 electrically connected to the holding capacitors 221a except the contact holes are not partially covered with the protective film 501, making it possible to reduce a stress generated on a substrate 500 as compared with a case in which the diffusion regions 511 except the contact holes are covered entirely. It is therefore possible, also in this embodiment, to obtain the same effect as described above.

Figure 7:
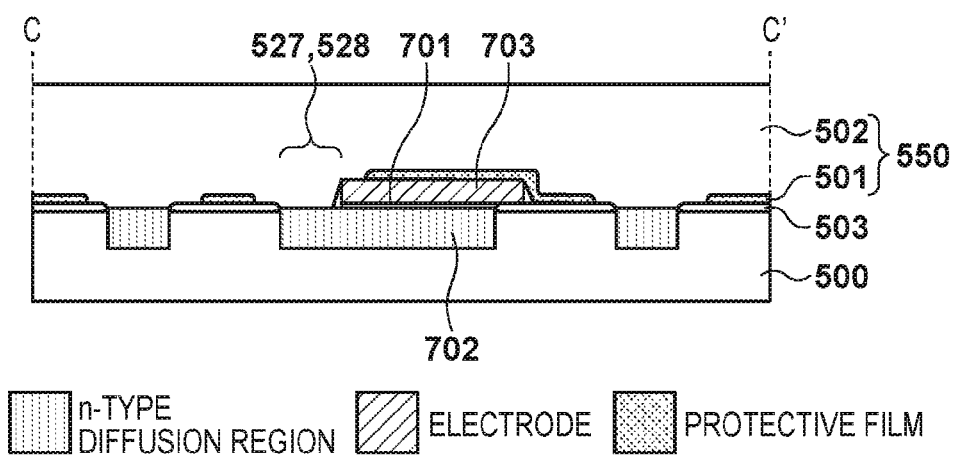
FIG. 7 is a sectional view showing the circuit of the solid-state image sensor in FIG. 5.

In this embodiment, the holding capacitor 221a uses a capacitive element formed by sandwiching an insulation film 701 serving as the second insulation film between an upper electrode 703 and a diffusion region 702, as shown in FIG. 7. The electrode 703 may be made of the same material as electrodes of transistors arranged in the peripheral region 112. For example, the electrode 703 may be a polysilicon electrode. Such a capacitive element can be used, for example, when an inexpensive process incapable of using a capacitive element such as a MIM (Metal-Insulator-Metal) capacitor is used or when a capacitive element having an increased area efficiency in order to reduce a chip size is used.

As compared with a case in which there is no protective film 501 in the diffusion regions 702 each serving as the fourth diffusion region of the corresponding one of the holding capacitors 221a arranged on the substrate 500, a stronger stress can be generated by the protective film 501 arranged on the diffusion region 702. In the first embodiment described above, the diffusion region of each holding capacitor 221 is fixed to a corresponding one of GND potentials, and thus not influenced by the leakage current very much even if the crystal defects are generated. In this embodiment, however, the signals generated in the pixels 120 pass through the diffusion regions 702 of the holding capacitors 221a. Therefore, if crystal defects increase near the boundary between each diffusion region 702 and an element isolation region 503, this may become the origin of a degradation in signal by a leakage current caused by the crystal defects.

In contrast, an area covered with the protective film 501 is reduced in a portion of the diffusion region 702 of each holding capacitor 221a not covered with the insulation film 701 as shown in FIGS. 6 and 7, making it possible to obtain the same effect as described above. As shown in FIGS. 6 and 7, configuration may be taken so that the portions of the diffusion regions 702 not covered with the insulation film 701 are not covered with the protective film 501.

As shown in FIG. 7, a portion 527 of the diffusion region 702 is not covered with the insulation film 701 but is covered with an insulation film 550. The portion 527 includes a portion 528 covered with an interlayer film 502 without intervening the protective film 501. In the arrangement shown in FIG. 7, the portion 527 and the portion 528 are the same. However, the present invention is not limited to this. The portion 528 may be a part of the portion 527 by partially covering the portion 527 of the diffusion region 702 with the protective film 501. In order to obtain the effect of this embodiment described above, the proportion of an area of the portion 527 except the portions 528 to an area of the portion 527 may be lower than the proportion of the area of each portion 524 to an area of the corresponding one of the portions 523 of the diffusion regions 513 described above in a planar view with respect to the substrate 500. The proportion of a film which generates a stronger stress on the substrate in a diffusion region of each holding capacitor 221a directly covered with the insulation film 550 may be lower than the proportion of the film in a diffusion region of a transistor which is not electrically connected to the holding capacitor 221a directly.

It is possible, by applying area-efficient capacitive elements like the holding capacitors 221 shown in this embodiment, to suppress a manufacturing cost or the unit cost of a chip by reducing a chip size.

Figure 8:
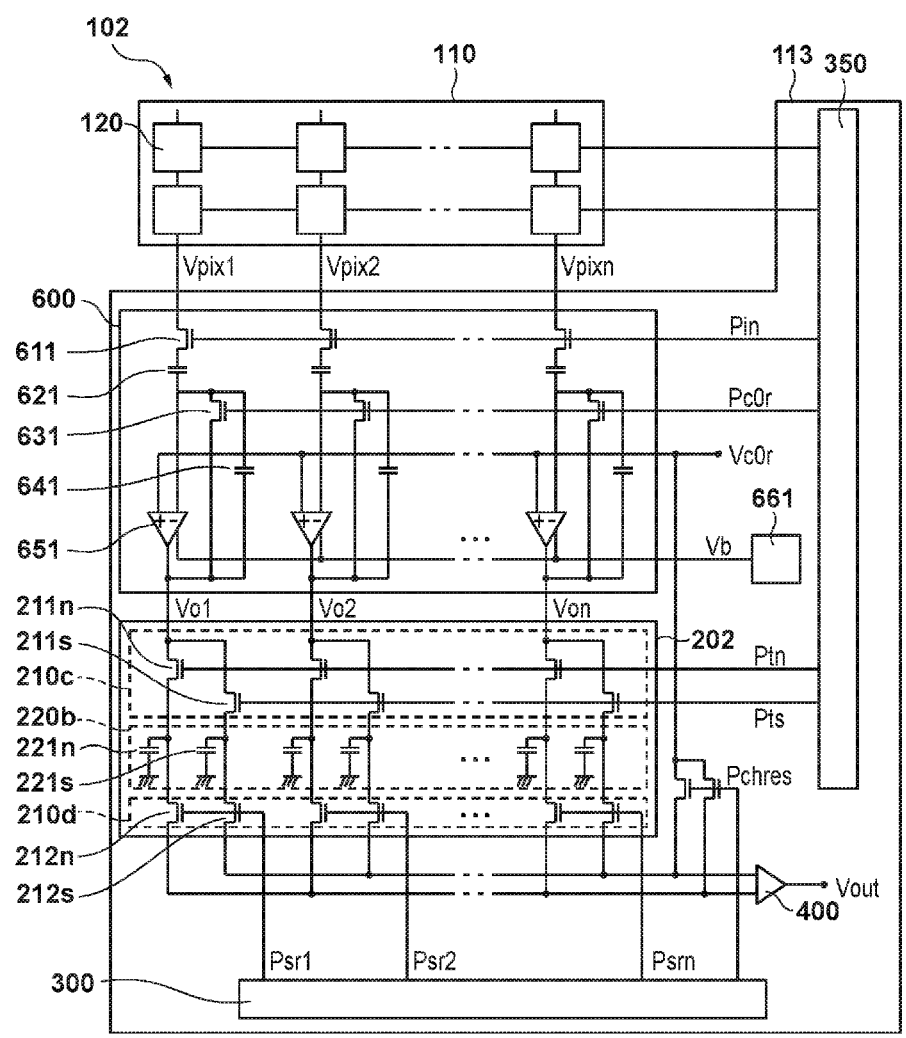
FIG. 8 is a block diagram showing an example of the arrangement of a solid-state image sensor according to an embodiment of the present invention.

A solid-state image sensor according to some embodiments of the present invention will be described with reference to FIGS. 8 to 11. FIG. 8 is a block diagram showing an example of the arrangement of a solid-state image sensor 102 according to a third embodiment of the present invention. As compared with a peripheral region 111 of a solid-state image sensor 100, a peripheral region 113 of the solid-state image sensor 102 includes a switched capacitor (SC) amplifier unit 600 serving as an amplifier unit which amplifies signals from pixels between a signal holding unit 202 and pixels 120 in an image sensing region 110. The peripheral region 113 further includes a bias circuit 661 configured to supply a bias voltage Vb to the SC amplifier unit 600. The signal holding unit 202 includes, in order to perform correlated double sampling, a transfer unit 210c including transistors 211s and 211n, a transfer unit 210d including transistors 212s and 212n, and a holding capacitor unit 220b including holding capacitors 221s and 221n. The solid-state image sensor 102 may be the same as the solid-state image sensor 100 in the arrangement except for this.

The SC amplifier unit 600 includes transistors 611 and 631, holding capacitors 621, feedback capacitors 641, and operational amplifiers 651. In accordance with a control signal Pin output from a control unit 350, the transistors 611 perform a transfer operation for inputting signals from pixels 120 to the holding capacitors 621 of the SC amplifier unit 600. The holding capacitors 621 are used to hold the signals received from the pixels 120 and perform clamp processing. The feedback capacitors 641 serve as negative feedback elements of the operational amplifiers 651. The amplification factor of each signal input to the SC amplifier unit 600 is decided based on the capacitance ratio of each holding capacitor 621 and a corresponding one of the feedback capacitors 641. Each operational amplifier 651 has the arrangement of a differential amplifier circuit as shown in, for example, FIG. 9A and outputs amplified signals to the signal holding unit 202. Electrode nodes Vo are nodes in portions where the SC amplifier unit 600 and the signal holding unit 202 are connected. A potential Vdd is a power supply voltage of the operational amplifier. The output of the SC amplifier unit 600 and the transistors 631 are reset switches which reset the SC amplifier unit 600 in accordance with a control signal PcOr output from the control unit 350. At the time of reset, a reference potential Vc0r applied to positive input terminals Vin+ of the operational amplifiers 651 resets two terminals of the feedback capacitors 641 and negative input terminals Vin− of the operational amplifiers 651.

Like the signal holding unit 200 of the first embodiment described above, the signal holding unit 202 is a sample-and-hold circuit which temporarily holds the signals output from the pixels 120 and amplified by the SC amplifier unit 600. Unlike the signal holding unit 200, however, the signal holding unit 202 includes two pairs of transistors 211 and 212, and holding capacitors 221 for each column in order to perform correlated double sampling. The transistors 211s and 211n transfer the signals of the electrode nodes Vo to the holding capacitors 221s and 221n in accordance with control signals Pts and Ptn output from the control unit 350. In accordance with the control signal Ptn, the transistors 211n perform a transfer operation, and each holding capacitor 221n holds the noise level of an offset voltage or the like of the SC amplifier unit 600. In accordance with the control signal Pts, the transistors 211s perform a transfer operation, and each holding capacitor 221s holds the signals amplified by the SC amplifier unit 600. The transistors 212s and 212n transfer the signals and the noise levels held in the holding capacitors 221s and 221n to an output amplifier 400 in accordance with control signals Psr output from a control unit 300. The output amplifier 400 outputs, to a circuit at a subsequent stage, the differences between the signals held in the holding capacitors 221s and the noise levels held in the holding capacitors 221n as a signal potential Vout.

Figure 10:
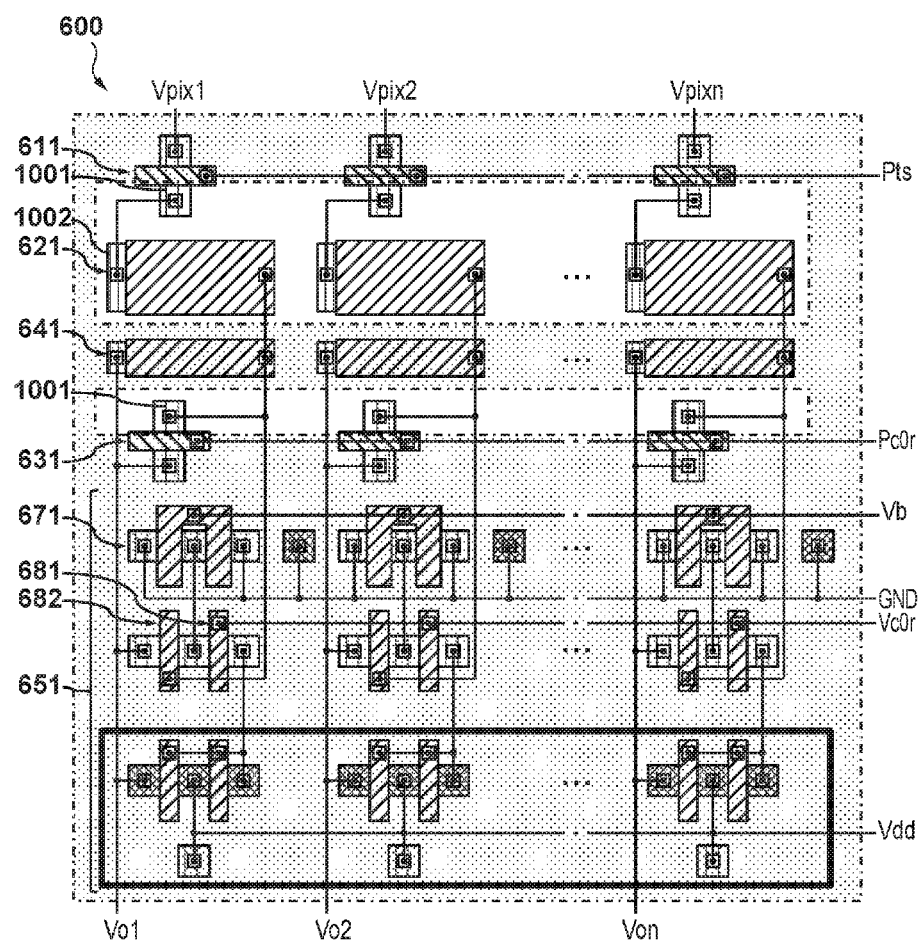
FIG. 10 is a plan view showing the circuit of the solid-state image sensor in FIG. 8.
Figure 10:
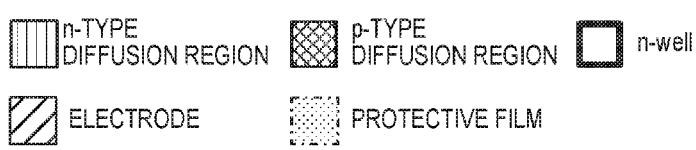

FIG. 10 is a plan view showing the SC amplifier unit 600 shown in FIG. 8. The signal holding unit 202 may be the same as the above-described signal holding unit 200 in each arrangement of the transistors 211 and 212, and the holding capacitors 221, and thus a description thereof will be omitted here. Of the diffusion regions of the transistors 611 and 631, a protective film 501 is not arranged in a portion on each diffusion region 1001 on a transmission path of the signals from the pixels 120 electrically connected to a corresponding one of the holding capacitors 621. That is, the transistors 611 and 631 may have the same arrangements as the above-described transistors 211 and 212. The protective film 501 is also not arranged in a portion on each diffusion region 1002 of the corresponding one of the holding capacitors 621 on the transmission path of the signals from the pixels 120. That is, each holding capacitor 621 may have the same arrangement as the above-described holding capacitor 221a. The SC amplifier unit 600 except the diffusion regions 1001 and the diffusion regions 1002 may be covered with the protective film 501. Like signal holding units 200 and 201, and the signal holding unit 202, a stress generated by the protective film 501 and an interlayer film 502 on a substrate 500 is also reduced by removing the protective film 501 in the SC amplifier unit 600. This makes it possible to suppress, with respect to the signals input from the pixels 120 to the SC amplifier unit 600, occurrence of crystal defects by the stress generated on the substrate 500 and an increase in an off leakage current of each transistor. The same effect as described above can also be obtained in an arrangement including an amplifier unit in the peripheral region 113 by appropriately selecting a node that may degrade the signals and not arranging the protective film 501. It is also possible, in this embodiment, to increase the SNR (signal-noise ratio) of each signal output from the pixels 120 and image quality to be obtained by including the amplifier unit in the peripheral region 113.

In the arrangement of the SC amplifier unit 600 shown in FIG. 10, the protective film 501 remains arranged on the diffusion regions of the feedback capacitors 641. This is because each operational amplifier 651 drives a corresponding one of the electrode nodes Vo connected to the diffusion regions of the feedback capacitors 641 at a predetermined potential, and thus there is no influence of the degradation in signal by a leakage current described above when the operational amplifier 651 operates.

A shape which removes the protective film 501 in the SC amplifier unit 600 is not limited to the arrangement shown in FIG. 10. The same effect as described above can be obtained by at least partially not covering, with the protective film 501, the diffusion regions 1001 and the diffusion regions 1002 except the portions of contact holes. For example, configuration may be taken so that a portion of each diffusion region 1002 not covered with the electrode of the corresponding one of the holding capacitors 621 is partially not covered with the protective film 501, and an electrode portion of the holding capacitor 621 may be covered with the protective film 501. For example, as shown in FIG. 4, a region without the protective film 501 may be extended in accordance with a process technology used in order to reduce the influence of an alignment shift or the like when the solid-state image sensor 102 is manufactured.

Figure 9A:
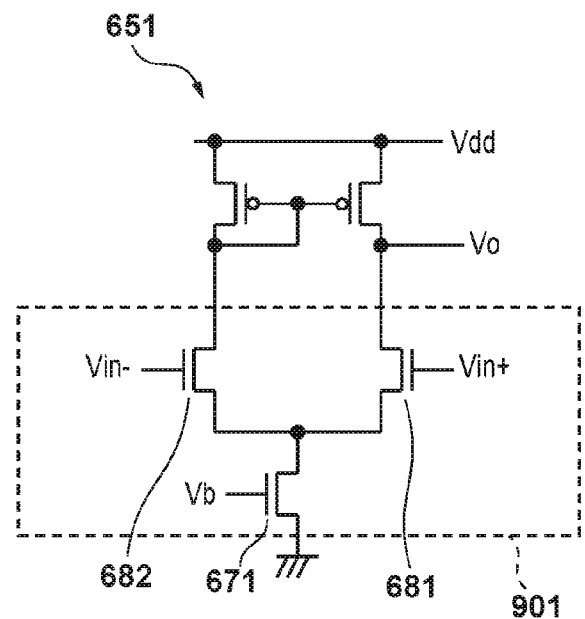
FIG. 9A is a circuit diagram showing an example of the arrangement of an operational amplifier of the solid-state image sensor in FIG. 8.
Figure 9B:
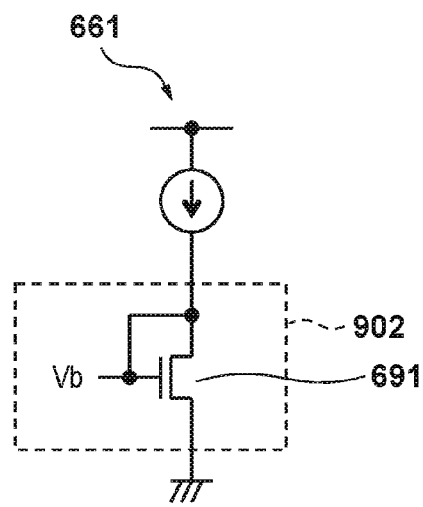
FIG. 9B is a circuit diagram showing an example of the arrangement of a bypass circuit of the solid-state image sensor in FIG. 8.
Figure 11:
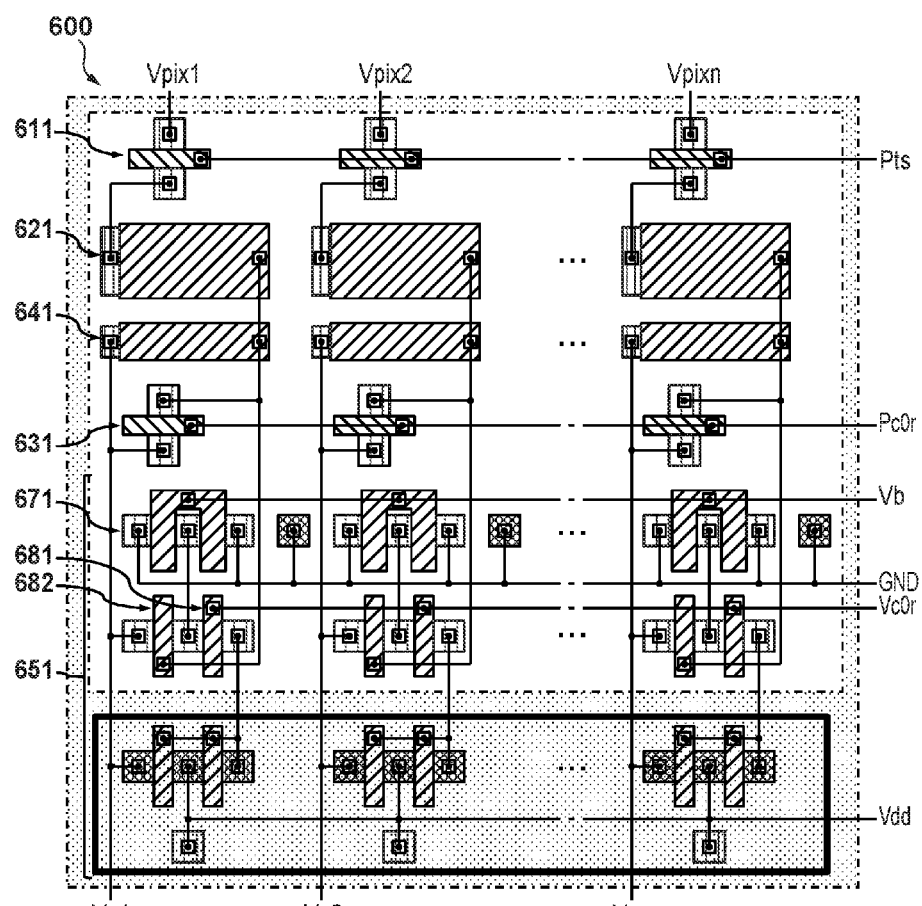
FIG. 11 is a view showing a modification of the plan view showing the circuit of the solid-state image sensor in FIG. 10.
Figure 11:
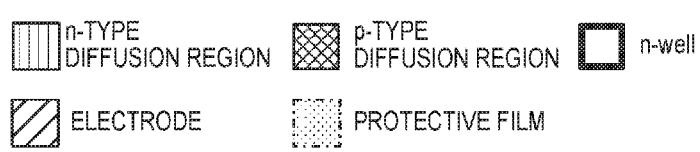

The amplification factor of the SC amplifier unit 600 is decided based on the capacitance ratio of each holding capacitor 621 and the corresponding one of the feedback capacitors 641. It is therefore that device characteristics may be the same from the viewpoint of stability or accuracy of the amplification factor. Therefore, configuration may be taken so that, like the holding capacitors 621, the feedback capacitors 641 are not covered with the protective film 501 either, as shown in FIG. 11. For example, if the holding capacitors 621 are not partially covered with the protective film 501, the protective film 501 in a similar shape may be arranged on the feedback capacitors 641. In the arrangement shown in FIG. 11, the protective film 501 does not cover the transistors 611 and 631, the holding capacitors 621, and the feedback capacitors 641. The protective film 501 does not cover a portion except a portion of an n-type well (n-well) on the substrate 500 in which p-type transistors of the operational amplifiers 651 are arranged either. More specifically, a transistor 671 connected to a current source surrounded by a dotted line 901 of FIG. 9A, and transistors 681 and 682 serving as an input differential pair are not covered with the protective film 501. As shown in FIG. 9A, the protective film 501 on the transistor 671 of the operational amplifier 651 is removed. Corresponding to this, the protective film 501 on a transistor 691 of a bias circuit 661 surrounded by a dotted line 902 of FIG. 9B may be removed in order to increase the accuracy of a current of a current mirror circuit.

A method of manufacturing a solid-state image sensor according to some embodiments of the present invention will be described with reference to FIGS. 12 and 13. FIG. 12 is a circuit diagram showing a pixel 120 arranged in an image sensing region 110. The pixel 120 includes a photoelectric conversion unit which converts incident light into an electrical signal and a transfer transistor which is controlled in accordance with a control signal Ptx output from a control unit 350. A transistor which operates in accordance with a control signal Pres resets the pixel 120. The control signal Pres may be output from, for example, the control unit 350.

FIGS. 13A to 13F are sectional views each showing a manufacturing process of the pixel 120 and a transistor 1310 which includes a diffusion region 511 electrically connected to a holding capacitor 221. First, the image sensing region 110 in which the pixel 120 is arranged and a peripheral region in which a peripheral circuit which includes a circuit for processing a signal output from the pixel 120 are formed in a p-well on a substrate 500.

In this embodiment, the peripheral region may be one of the peripheral regions 111, 112, and 113 in the respective embodiments described above. The transistor 1310 has the same arrangement as the transistor 212 shown between the line B-B' of FIG. 2. However, the present invention is not limited to this. The transistor 1310 may have any arrangement of the transistor which includes the diffusion region 511 electrically connected to the holding capacitor 221 described above.

Figure 13A:
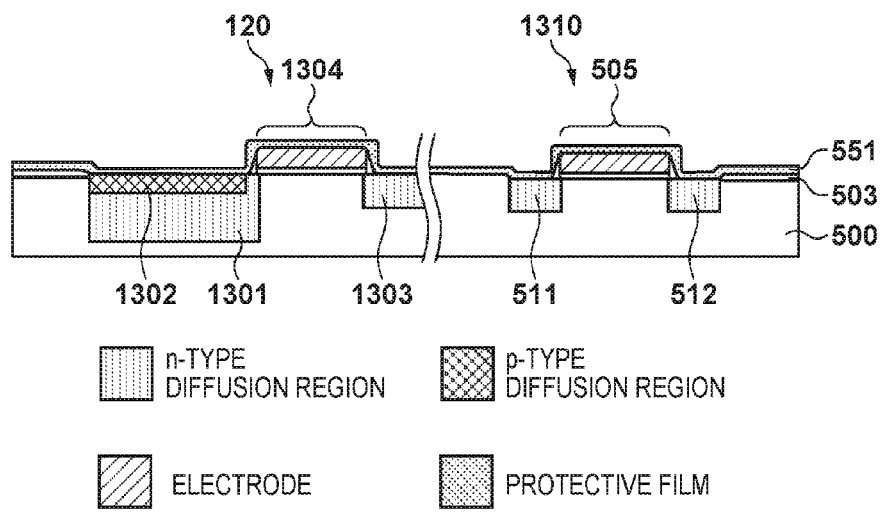
FIGS. 13A to 13F are views showing steps in a method of manufacturing the solid-state image sensor according to the embodiment of the present invention.

The pixel 120 includes n-type diffusion regions 1301 and 1303, and a gate portion 1304 formed in the p-well on the substrate 500. The diffusion region 1301 and the p-well on the substrate 500 form a p-n junction and function as a photodiode. The diffusion region 1303 functions as a floating diffusion portion which converts, into an electrical signal, charges generated in the photodiode formed by the diffusion region 1301 and the substrate 500. The gate portion 1304 includes a gate electrode and a gate insulation film, and forms a channel region between the diffusion region 1301 and the diffusion region 1303 in accordance with the control signal Ptx. As shown in FIG. 13A, a heavily doped diffusion region 1302 of a p type which is a conductivity type opposite to that of the diffusion region 1301 may be arranged on the surface side of the substrate 500 in the diffusion region 1301. The diffusion region 1301 is separated from the surface of the substrate 500 by arranging the diffusion region 1302, reducing dark current components. The diffusion region 511 and a diffusion region 512 of the transistor 1310, and the diffusion regions 1301 and 1303 of the pixel 120 are the same n-type diffusion regions. However, they may be different from each other in concentration of an impurity contained in the diffusion regions. For example, the diffusion regions 511 and 512, and 1303 may have the same impurity concentration, and the diffusion regions 511, 512, and 1303 and the diffusion region 1301 may have the different impurity concentrations. Including the diffusion regions of the holding capacitors 221 described above, the impurity concentration can be decided appropriately in accordance with the arrangement of each element.

After the image sensing region 110 including the pixel 120 and the peripheral region including the transistor 1310 are formed, the process advances to an insulation film formation step of forming an insulation film 550. As the insulation film formation step, first, silicon nitride 551 is deposited by using, for example, plasma CVD, thermal CVD, or the like in order to form the protective film 501. At this time, the deposited silicon nitride 551 covers both the image sensing region 110 and the peripheral region. The deposited silicon nitride 551 may also cover the substrate 500 entirely. FIG. 13A shows a state in which this silicon nitride 551 is deposited.

Figure 13B:
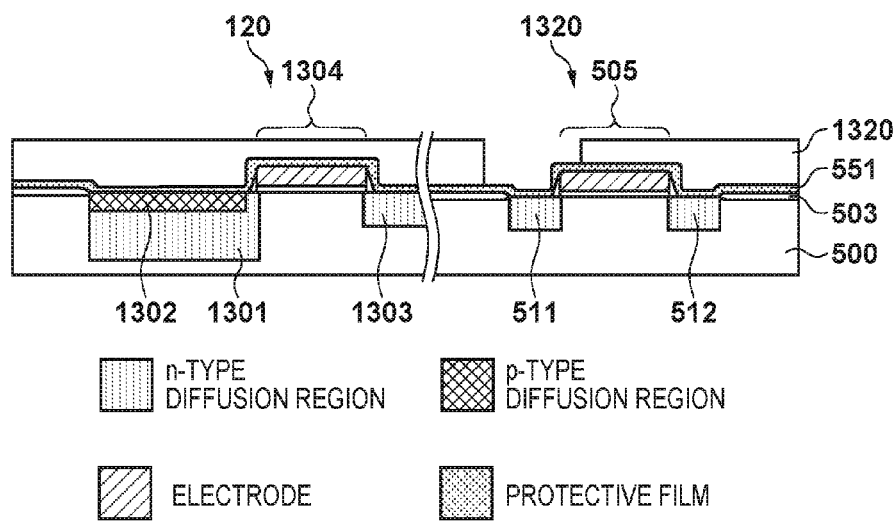
Figure 13C:
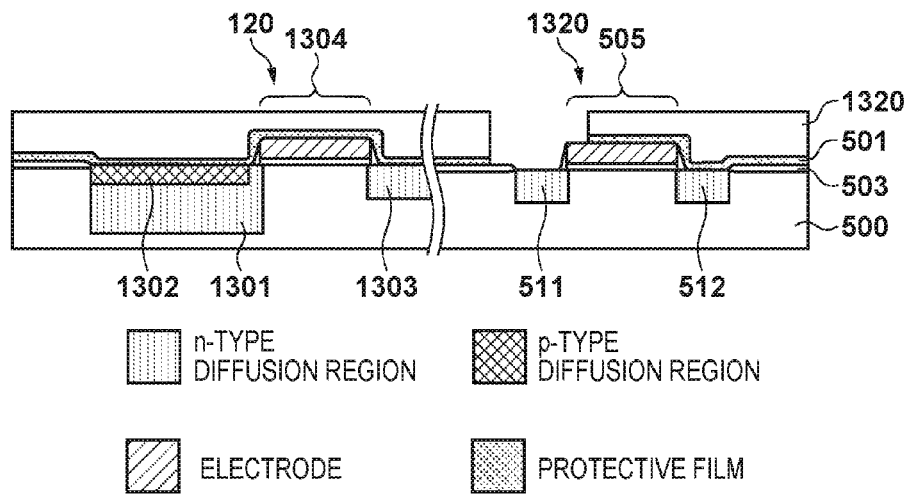

Then, a removal step of forming the protective film 501 by at least partially removing silicon nitride of the deposited silicon nitride 551 on the diffusion region 511 is performed. FIG. 13B shows a state in which a photoresist mask 1320 is formed, which has an opening in a portion from which silicon nitride of the silicon nitride 551 is removed. In this embodiment, the photoresist mask 1320 has the opening on the diffusion region 511 electrically connected to a holding capacitor of the transistor 1310. Alternatively, configuration may be taken so that the photoresist mask 1320 does not have any opening on a diffusion region other than the diffusion region 511. The opening of the photoresist mask 1320 is provided in a region where the protective film 501 is not arranged in each embodiment described above. After the photoresist mask 1320 is formed, the silicon nitride 551 in an opening portion of the photoresist mask 1320 is removed as shown in FIG. 13C by using, for example, a wet etching method, a plasma etching method, or the like. The protective film 501 is formed by this step. The protective film 501 arranged on the image sensing region 110 can also function as an antireflection film.

Figure 13D:
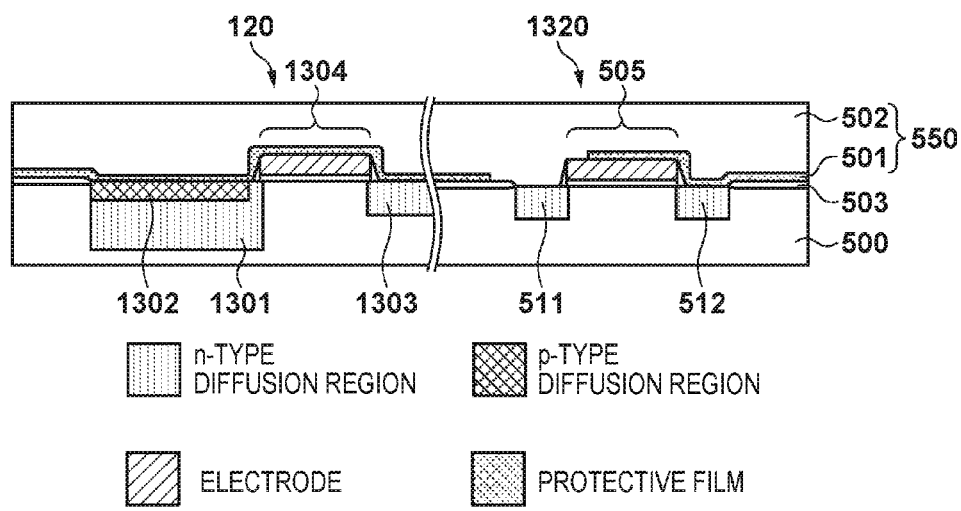

After the protective film 501 is formed by the removal step, BPSG is, for example, deposited by using thermal CVD and planarized by using a CMP method, forming an interlayer film 502. FIG. 13D shows a state in which the interlayer film 502 is formed. A material used for the interlayer film 502 is not limited to silicon oxide like BPSG, but can be a material having a refractive index different from that of the protective film 501 and a stress generated on the substrate 500 which is smaller than on the protective film 501 when the substrate 500 is covered.

Figure 13E:
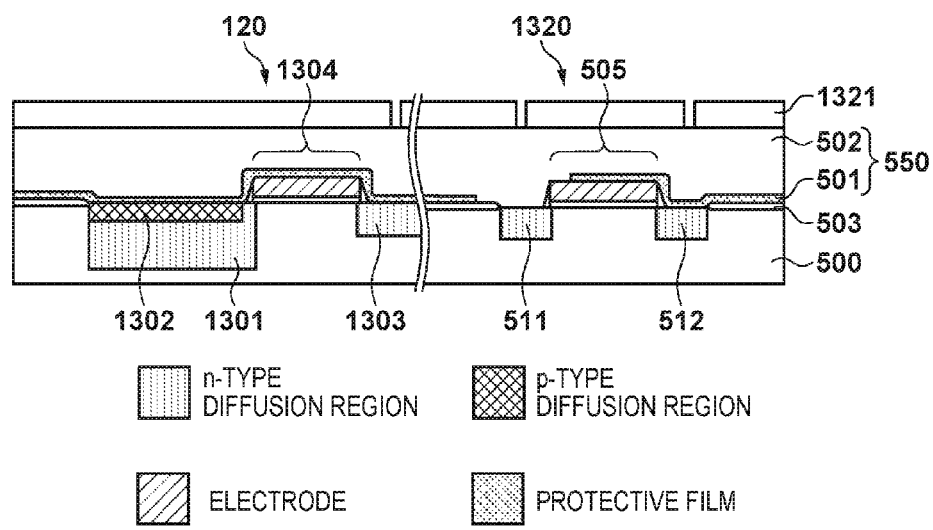

After the interlayer film 502 is formed, a contact hole for electrically connecting a wiring and each element arranged in the image sensing region 110 and the peripheral region is formed in the insulation film 550. First, as shown in FIG. 13E, a photoresist mask 1321 is formed, which has openings on portions of the insulation film 550 where the contact holes are arranged. The contact holes can be arranged, for example, on the diffusion regions, the gate electrodes, and the like of the respective elements arranged in the image sensing region 110 and the peripheral region, in addition to the diffusion region 1303 of the pixel 120, and the diffusion regions 511 and 512 of the transistor 1310 shown in FIG. 13E.

Figure 13F:
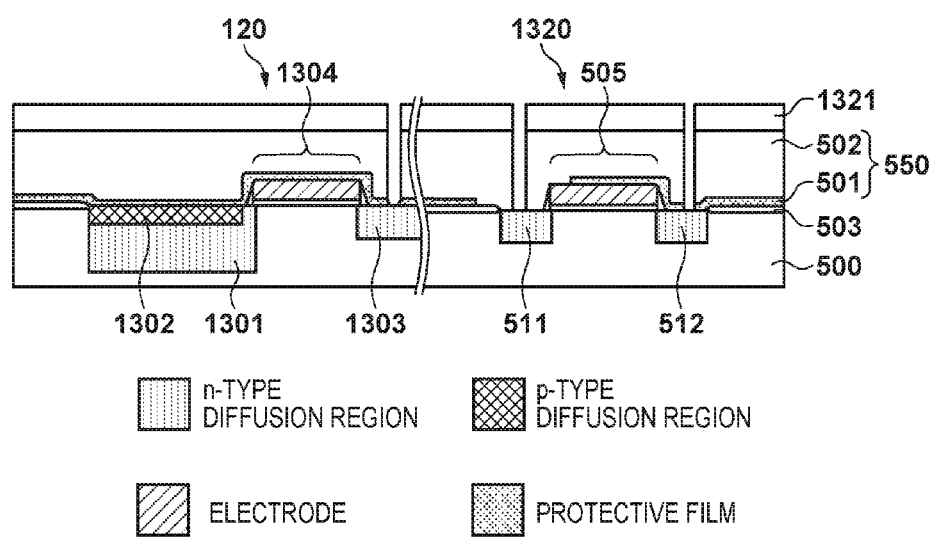

After the photoresist mask 1321 is formed, the insulation film 550 of an opening portion of the photoresist mask 1321 is etched by, for example, using the plasma etching method or the like, forming contact holes 504. When a contact hole is formed in a portion where the protective film 501 and the interlayer film 502 are stacked, first, an etching step of etching the interlayer film 502 using the protective film 501 as an etching stopper is performed. After the interlayer film 502 is etched, the process may include an etching step of further etching the protective film 501 in order to form the contact hole. FIG. 13F shows a state in which the contact holes 504 are formed. Note that the wall surface of the contact hole 504 arranged on the diffusion region 511 electrically connected to the holding capacitor may be formed by the interlayer film 502. On the other hand, the wall surface of each contact hole 504 arranged on a corresponding one of the diffusion regions other than the diffusion region 511 may be formed by a stacked structure of the protective film 501 and the interlayer film 502.

After the contact holes 504 are formed, an impurity such as $BF_2$ ions may be implanted into the diffusion regions via the contact holes by using an ion implantation method in order to further ensure electrical connection between the diffusion regions and electric conductors arranged in the contact holes. After ion implantation, the photoresist mask 1321 is removed, and the implanted impurity is activated. Subsequently, an electric conductor such as polysilicon or a metal is embedded in each contact hole and further, a wiring layer is formed. A known technique can be used for the manufacturing process of the solid-state image sensor after the contact holes 504 are formed, and thus a detailed description thereof will be omitted.

With the above-described process, the stress generated by the protective film 501 on the substrate 500 is reduced, and occurrence of crystal defects on the substrate caused by the stress is suppressed. As described above, this makes it possible to suppress, with respect to the signals output from the pixels 120, the influence of the leakage current generated by the crystal defects on the substrate 500 and a decrease in the quality of a captured image to be obtained.

With the above-described process, it also becomes possible to set different threshold voltages between a transistor largely covered with the protective film 501 and a transistor from which the protective film 501 is removed in a wide range. This is because between a case in which the protective film 501 covers the substrate 500 and in a case in which the protective film 501 does not cover the substrate 500, the stress generated on the substrate 500 differs, and thus the proportion of an area occupied by the protective film 501 to areas of the diffusion regions and the transistors differs, making the threshold voltages of the transistors different from each other. For example, a transistor on a transmission path of a signal connected to a capacitor which holds the signals from the pixels 120, and transistors included in a control unit 300 and the control unit 350 which controls the pixels 120 and the signal holding unit 200 may be different in threshold voltage. In order to decide the thresholds of the respective transistors, the proportion of an area of the first portion except the the second portion of each diffusion region 511 to an area of the first portion described above and the proportion of an area of the fourth portion to an area of the third portion of each diffusion region 512, respectively, may be decided. It is possible, by changing the range of the protective film 501 arranged on the respective transistors, to form the transistors different in threshold voltage without, for example, adding a step of implanting an impurity into channel regions on different conditions or the like. This also makes it possible to establish an inexpensive manufacturing process while decreasing the number of steps.

The four embodiments of the present invention have been described above. However, the present invention is not limited to these embodiments. The respective embodiments described above can appropriately be modified and combined without departing from the scope of the present invention. For example, in the respective embodiments described above, all the diffusion regions on the transmission path of the signals connected to the capacitors holding the signals output from the pixels are shown so as not to be covered with the protective film 501. It becomes possible, however, to reduce the stress generated on the substrate 500 and obtain the above-described effect by decreasing the proportion of the protective film 501 in at least one of the diffusion regions. For example, in the third embodiment, the proportion of the protective film 501 on one of the diffusion regions, on the transmission path of the signals from the pixels 120, of the signal holding unit and the holding capacitor of the amplification unit may be decreased. As described above, the peripheral region 111 includes the plurality of holding capacitors 221 and 621 having the decreased proportion of the protective film 501 on the diffusion regions, and the holding capacitors 221 and the holding capacitors 621 may be arranged in the signal holding unit and amplification unit, respectively.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-021236, filed Feb. 5, 2016, which is hereby incorporated by reference wherein in its entirety.

What is claimed is:

1. A solid-state image sensor comprising a substrate which includes an image sensing region in which a pixel is arranged and a peripheral region which includes a circuit configured to process a signal output from the pixel, and a first insulation film arranged over the substrate,
wherein the peripheral region includes:
a holding capacitor configured to hold the signal,
a first transistor including a first diffusion region electrically connected to the holding capacitor, and
a second transistor including a second diffusion region, and configured to perform at least one of control of the pixel, control of the first transistor, and processing of the signal,
wherein the first insulation film includes:
a first film including a first material, and
a second film including a second material on the first film,
wherein the first film and the second film are arranged in the image sensing region and the peripheral region,
wherein a first portion of the first diffusion region is covered with the first insulation film,
wherein the first portion includes a second portion covered with the second film without the first film intervening therebetween,
wherein a third portion of the second diffusion region is covered with the first insulation film,
wherein the third portion includes a fourth portion covered with the first film and the second film,
wherein a stress generated in the substrate from the fourth portion is larger than a stress generated in the substrate from the second portion, and
wherein in a planar view with respect to the substrate, a proportion of an area of the first portion except the second portion to an area of the first portion is lower than a proportion of an area of the fourth portion to an area of the third portion.

2. The sensor according to claim 1, wherein the first diffusion region is not covered with the first film.

3. The sensor according to claim 1,
wherein the first transistor further includes a third diffusion region not electrically connected to the holding capacitor,
wherein a fifth portion of the third diffusion region is covered with the first insulation film,
wherein the fifth portion includes a sixth portion covered with the first film and the second film, and
wherein in the planar view with respect to the substrate, the proportion of the area of the first portion except the second portion to an area of the first portion is lower than a proportion of an area of the sixth portion to an area of the fifth portion.

4. The sensor according to claim 1, wherein the first transistor further includes a third diffusion region not electrically connected to the holding capacitor, and a gate portion configured to form a channel region between the first diffusion region and the third diffusion region, and
the first diffusion region, the third diffusion region, and the gate portion are not covered with the first film.

5. The sensor according to claim 1, wherein the first transistor includes a transistor configured to perform a transfer operation of at least one of inputting the signal to the holding capacitor and outputting the signal from the holding capacitor.

6. The sensor according to claim 1, wherein the first transistor includes a transistor configured to clamp the signal held in the holding capacitor.

7. The sensor according to claim 1, wherein the holding capacitor includes a fourth diffusion region, a second insulation film arranged on a part of the fourth diffusion region, and an electrode arranged on the second insulation film,
the first diffusion region and the fourth diffusion region are electrically connected,
wherein a seventh portion of the fourth diffusion region is not covered with the second insulation film but is covered with the first insulation film,
wherein the seventh portion includes an eighth portion covered with the second film without the first film intervening therebetween, and
wherein in the planar view with respect to the substrate, a proportion of an area of the seventh portion except the eighth portion to an area of the seventh portion is lower than a proportion of an area of the fourth portion to an area of the third portion.

8. The sensor according to claim 7, wherein the seventh portion is not covered with the first film.

9. The sensor according to claim 1, wherein the first transistor includes a transistor configured to reset the holding capacitor.

10. The sensor according to claim 1, wherein the peripheral region includes a signal holding unit configured to temporarily hold the signal, and
the signal holding unit includes the holding capacitor and the first transistor.

11. The sensor according to claim 1, wherein the peripheral region includes an amplification unit configured to amplify the signal, and
the amplification unit includes the holding capacitor, the first transistor, a feedback capacitor configured to decide an amplification factor, and an operational amplifier configured to amplify the signal.

12. The sensor according to claim 11, wherein the peripheral region further includes a signal holding unit configured to temporarily hold the signal, and
includes the plurality of holding capacitors, and
each of the signal holding unit and the amplification unit holds the holding capacitor.

13. The sensor according to claim 11, wherein the feedback capacitor and the operational amplifier are not at least partially covered with the first film.

14. The sensor according to claim 1, wherein the proportion of the area of the first portion except the second portion to an area of the first portion is zero.

15. A solid-state image sensor comprising a substrate which includes an image sensing region in which a pixel is arranged and a peripheral region which includes a circuit configured to process a signal output from the pixel, and a first insulation film arranged over the substrate,
  wherein the peripheral region includes:
    a holding capacitor configured to hold the signal,
    a first transistor including a first diffusion region electrically connected to the holding capacitor, and
    a second transistor including a second diffusion region, and configured to perform at least one of control of the pixel, control of the first transistor, and processing of the signal,
  wherein the first insulation film includes:
    a first film including silicon nitride, and
    a second film including silicon oxide on the first film,
  wherein the first film and the second film are arranged in the image sensing region and the peripheral region,
  wherein a first portion of the first diffusion region is covered with the first insulation film,
  wherein the first portion includes a second portion covered with the second film without the first film intervening therebetween,
  wherein a third portion of the second diffusion region is covered with the first insulation film,
  wherein the third portion includes a fourth portion covered with the first film and the second film, and
  wherein in a planar view with respect to the substrate, a proportion of an area of the first portion except the second portion to an area of the first portion is lower than a proportion of an area of the fourth portion to an area of the third portion.

16. A solid-state image sensor comprising a substrate which includes an image sensing region in which a pixel is arranged and a peripheral region which includes a circuit configured to process a signal output from the pixel, and a first insulation film arranged over the substrate,
  wherein the peripheral region includes:
    a holding capacitor configured to hold the signal,
    a first transistor including a first diffusion region electrically connected to the holding capacitor, and
    a second transistor including a second diffusion region, and configured to perform at least one of control of the pixel, control of the first transistor, and processing of the signal, and
  wherein the first insulation film includes:
    a first film including silicon nitride, and
    a second film including silicon oxide on the first film,
  wherein the first film and the second film are arranged in the image sensing region and the peripheral region,
  a wall surface of a first contact hole formed in the first insulation film for a first contact plug connected to the first diffusion region is formed by the second film,
  the first film is arranged apart from the first contact plug, and
  a wall surface of a second contact hole, formed in the first insulation film, for a second contact plug connected to the second diffusion region is formed by the first film and the second film.

* * * * *